United States Patent [19]
Mize

[11] 3,827,073
[45] July 30, 1974

[54] GATED BILATERAL SWITCHING SEMICONDUCTOR DEVICE

[75] Inventor: Jack P. Mize, Richardson, Tex.

[73] Assignee: Texas Instruments Incorporated, Dallas, Tex.

[22] Filed: Sept. 7, 1971

[21] Appl. No.: 178,438

Related U.S. Application Data

[63] Continuation of Ser. No. 870,772, May 1, 1969, abandoned.

[52] U.S. Cl. .................... 357/39, 357/6, 357/68, 357/73, 340/173, 307/253

[51] Int. Cl. .................... H01l 11/00, H01l 15/00

[58] Field of Search .......... 317/234, 235, 41.1, 5.4, 317/3.1; 340/173; 307/253

[56] References Cited

UNITED STATES PATENTS

| | | | |
|---|---|---|---|
| 3,271,591 | 9/1966 | Ovshinsky | 317/234 |
| 3,310,687 | 3/1967 | Howell | 317/234 |
| 3,336,484 | 8/1967 | Ovshinsky | 317/235 |
| 3,391,310 | 7/1968 | Gentry | 317/235 AB |
| 3,445,823 | 5/1969 | Petersen | 340/173 |
| 3,447,067 | 5/1969 | Spofford | 307/253 |
| 3,493,848 | 2/1970 | Galloway | 307/253 |
| 3,504,241 | 3/1970 | Dumanevich et al. | 317/235 AE |
| 3,634,927 | 1/1972 | Neale et al | 317/234 N |
| 3,675,090 | 7/1972 | Neale | 317/234 R |

FOREIGN PATENTS OR APPLICATIONS

| | | | |
|---|---|---|---|
| 1,078,790 | 8/1967 | Great Britain | 317/234 J |

*Primary Examiner*—Andrew J. James
*Attorney, Agent, or Firm*—Harold Levine; James T. Comfort; James O. Dixon

[57] ABSTRACT

There is disclosed herein a self-triggering switching device which may be either symmetrical or non-symmetrical. The device comprises a plurality of interleaved layers of semiconductor materials of opposite conductivity types forming a plurality of p-n junctions. Two main current-carrying electrodes are affixed to the external layers and a trigger electrode including a layer of active glass is affixed to one of the intermediate layers providing controlled "turn-on" of the device.

3 Claims, 3 Drawing Figures

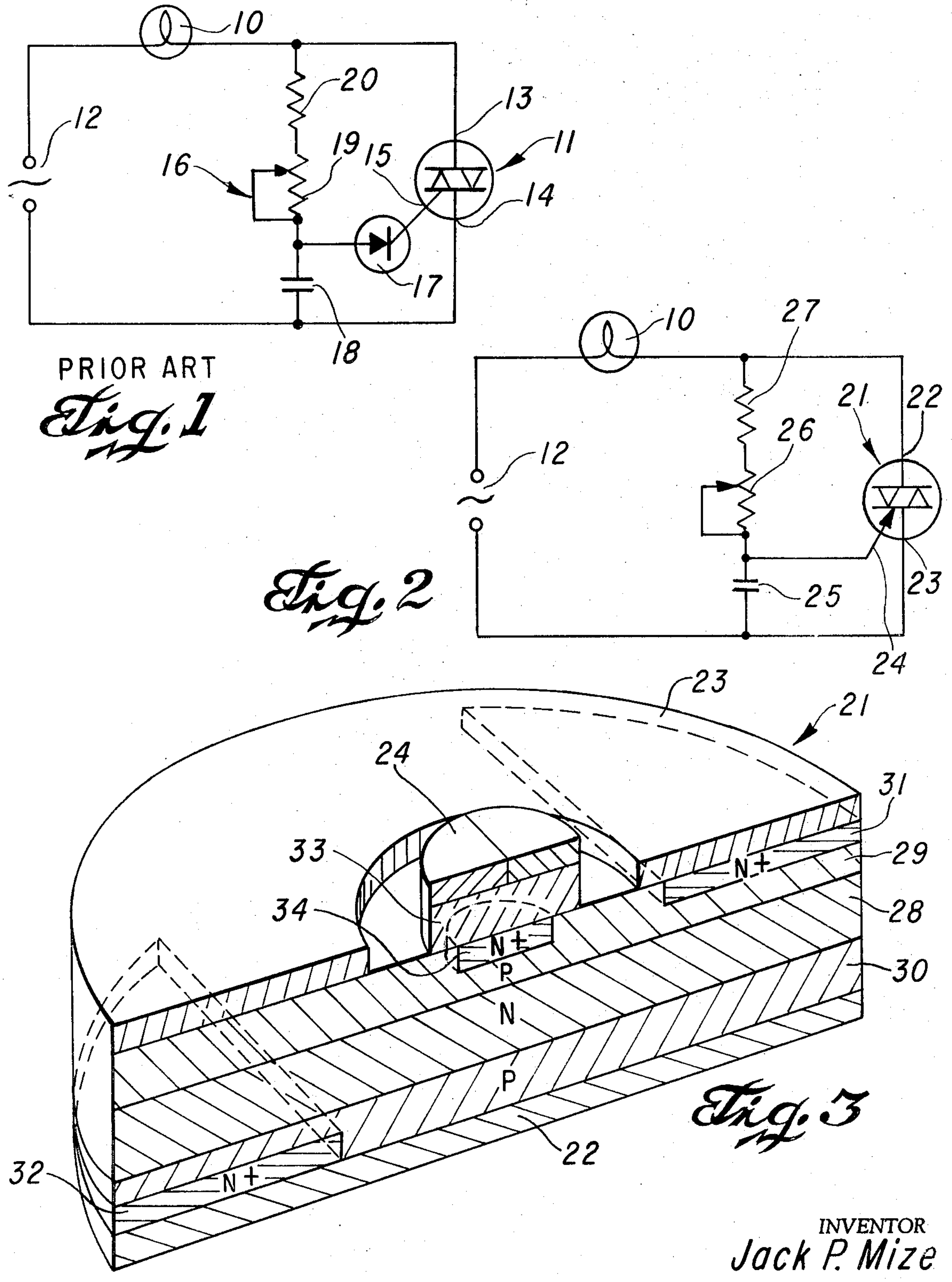
PRIOR ART Fig. 1, Fig. 2, Fig. 3
INVENTOR
Jack P. Mize

GATED BILATERAL SWITCHING SEMICONDUCTOR DEVICE

This is a continuation of application Ser. No. 820,772, filed May 1, 1969, and now abandoned.

The present invention relates in general to semiconductor switch devices and in particular to improvements in semiconductor devices of multi-layer type having bilateral switch-like characteristics.

One form of currently available device, generally referred to as a controlled rectifier, is a four layer device having a pair of main current-carrying and a third trigger or control electrode. When connected in circuit, significant current conduction across the main electrodes is blocked until a small controlled current of suitable magnitude is applied to the control electrode. Such form of device is composed of a body of silicon semiconductor material having four layers with adjacent layers being of opposite conductivity type to form three p-n junctions and having an electrical terminal connected to each of the outside layers. When one terminal is biased in one polarity with respect to the other terminal, the two p-n junctions nearest the terminals become reversely biased and the center p-n junction becomes forwardly biased. Thus, a high impedance is presented between the terminals, unless a sufficiently large potential is applied between the terminals to cause the two p-n junctions nearest the terminals to break down and conduct current in the reverse direction. When the one terminal is biased in the other polarity with respect to the other terminal, the two p-n junctions nearest the terminals become forwardly biased and the center p-n junction becomes reversely biased. Thus, a high impedance is again presented between the terminals. However, if the potential applied between the terminals is increased or, more importantly, control current of suitable magnitude and polarity is applied to one of the intermediate layers through a control electrode, eventually not only does the center p-n junction break down, but, under suitable conditions, reverses in polarization and a very low impedance is presented between the terminals. Thus, with suitable control circuitry for the trigger electrode, the four layer, three terminal device of the above type has found many applications, particularly for controlling power to a load.

The particularly desirable quality of such devices is their capability of switching large currents in response to very small control current. It is an object of this invention to reduce the complexity of the trigger circuit by, in effect, rendering this type of semiconductor self-triggerable, without additional complex circuitry as an assist element.

To provide full-wave control of alternating current power, a pair of the aforementioned devices must be interposed between the supply and the load and control circuitry used to selectively deliver independent triggering pulses to each device of the pair in accordance with a desired operating scheme. More recently, controlled bi-directional current conducting semiconductors have been provided. These semiconductors normally exhibit a high impedance characteristic between two main current terminals. When a relatively low trigger impulse is applied to a third or gate terminal, the device switches to a second state, wherein a low impedance exists between the current-carrying terminals. These semiconductors are basically five layer devices analogous to the four layer devices previously described and may be considered a pair of four layer devices with the three center layers common to each of the pair. Thus, these devices permit current conduction in either direction with equal facility. Obviously, the bilateral characteristics of the main current conducting path have rendered the bi-directional current conducting semiconductor a more suitable device for the control of alternating current than the four layer controlled rectifier, even though, in certain circumstances, the trigger circuitry may be more complex.

Recently, non-oxide, active or semiconducting glasses have been developed which exhibit symmetrical switching characteristics upon application of an alternating current voltage as disclosed, for example, in U.S. Pat. No. 3,117,013. Devices made with such glasses, while demonstrating a selftriggering switching characteristic, as above referred to, have not been shown as capable of carrying any large amount of power to a load nor have they been shown to be repeatedly reproducible from a manufacturing standpoint. No significant commercial purposes have been found for such devices, presumably since they suffer from an uncontrollable trigger point similar to the defect of previously suggested uncontrolled five layer devices. It is an object of this invention to provide a device in which the active glass may be utilized to enhance the operation of previously demonstrated controlled rectifiers and bilateral switching devices and hence reduce the complexity of the trigger circuitry required for effective controlled switching of such devices.

Thus, in accordance with the invention, there is provided a semiconductor device in which the gate or trigger electrode of a controlled rectifier or bilateral switch is overlaid with a layer of active glass which will exhibit bilateral switching with relative resistance characteristics so as to cause triggering of the semiconductor device upon the application of a predetermined voltage therethrough.

Further objects and advantages of the invention will be more clearly understood by reference to the following complete description thereof, taken in connection with the accompanying drawings, wherein:

FIG. 1 depicts an elementary prior art circuit for controlling alternating current to a load;

FIG. 2 depicts a circuit utilizing a semiconductor device in accordance with the present invention; and FIG. 3 depicts a perspective view partly in cross-section of the device constructed in accordance with the invention.

FIG. 1 illustrates a circuit for supplying alternating current to a load 10, such as an incandescent lamp. Load 10 is serially connected with a controlled bilateral semiconductor device 11 across the source of alternating current 12. As is well-known in the prior art, the bilateral semiconductor device 11 has main power electrodes 13 and 14 and normally exhibits high impedance until a trigger pulse is applied to control electrode 15. Thus, the device 11, in its normal state, is "of". A triggering circuit must be provided for reducing the bilateral semiconducting device 11 to a low impedance state and hence turn the device "on". Such a trigger circuit must include an R-C network 16 and a voltage triggerable device 17. The R-C network 16 includes a capacitor 18 and a variable resistance 19, which variable resistance 19 is adjustable to vary time constant of the circuit and therefore the amount of power applied to the load 10. Conveniently, the trigger circuit may also include a current limiting resistance 20.

By using, in the foregoing exemplary circuit, a simple, purely resistive load and a bilateral semiconductor device, the trigger circuit required to control the power in the circuit is greatly simplified as contrasted with the trigger circuits wherein current to reactive loads is to be controlled or wherein pairs of controlled rectifiers are utilized. However, even such a relatively elementary trigger circuit may be simplified as shown in FIG. 2 by use of a device in accordance with the invention and similar advantages will be found in circuits wherein more complex triggering arrangements are required.

In accordance with present invention, the circuit for supplying alternating power to a load may be reduced in complexity by the elimination of the separate triggering device 17. As depicted in FIG. 2, the circuit comprises a bilateral semiconductor device 21 constructed in accordance with the invention for supplying and controlling power to load 10 from power source 12. The bilateral current conducting device includes main electrodes 22 and 23 and a trigger electrode 24. Since the trigger electrode exhibits a rapid change in impedance upon application of a predetermined voltage, a simple R-C time constant network consisting of a capacitor 25, a variable resistance 26, and a fixed resistor 27 is all that is required for a controlled operation of the trigger electrode. It is therefore readily evident that a device in accordance with the present invention greatly reduces the complexity and the cost of the trigger circuit.

The bilateral self-triggering semiconductor device 21 is depicted in FIG. 3 and includes a plurality of interleaved semiconductor layers or regions of opposite conductivity type and includes a central region 28 of, for example, n-conductivity type silicon having regions 29, 30 of p-type conductivity silicon on either side thereof. In portions of the external p-type conductivity regions 29, 30, n+ conductivity regions 31, 32 are placed.

As will be recognized, the five layers or regions 28–32 represent bilateral silicon controlled rectifier structure which can be considered as a pair of complementary four layer controlled rectifiers leaving three central layers common to both or a pair of n-p-n transistors leaving a common collector. Electrode 22 is applied at one end of the device completely across the bottom thereof, shorting the junction between regions 30 and 32 and forming a shorted emitter-base connection. Similarly, electrode 23 forms a shorted emitter-base connection to the upper transistor section by overlying and shorting the junction between regions 29 and 31. Trigger electrode 24 is connected to the base of one of the transistor sections through a layer 33 of active glass overlying an injection region or auxiliary emitter 34. Upon the application of a predetermined voltage to the trigger electrode, the device, being symmetrical, will conduct current with equal facility in either direction.

The active glass layer 33 preferably has a composition of 55 percent tellurium, 38 percent arsenic, 4 percent germanium and 3 percent silicon (the percent being expressed in atomic percent or in weight percent — 68.5 percent Te, 22.8 percent As, 2.8 percent Ge, and 0.89 percent Si) deposited on the injection region by a flash evaporation technique. This glass will normally have a high impedance characteristic. Upon application of voltage across the layer, the high impedance characteristic will be maintained until a predetermined breakdown voltage is reached whereby the impedance is rapidly reduced to a very low value. The breakdown voltage can be closely controlled by controlling the thickness of the glass layer deposited during the evaporation procedure. The pulse of current through the active glass layer 33 triggers conduction through main power electrodes 22 and 23 (FIG. 2) delivering power to the load 10. Since the voltage across the active glass layer 33 is then reduced to a negligible value, the layer returns to its normal high impedance state. With a reversal of polarity across the main terminal, the reversed junction of the semiconductor layers 28, 29, and 30 returns to its high impedance state and causes voltage rise across the active glass layer 33 to start a new triggering cycle. Adjustment of variable resistor 26 will adjust the rise time of the voltage across layer 33 and hence adjust the amount of power to the load 10.

While the invention has been disclosed in accordance with the preferred embodiment thereof, it will be appreciated by one skilled in the art that many changes may be made therein without departing from the spirit and scope of the invention. For example, the active glass layer 33 may be of any composition shown to exhibit a reversible impedance change. Further, the semiconductor regions maybe of any gate controlled device configuration.

What is claimed is:

1. A gated bilateral switching semiconductor device comprising in combination:

a. a main body of single crystal semiconductor material having first, second and third layers of alternating conductivity types forming first and second p-n junctions between said first and second layers and between said second and third layers, respectively; said first and third layers each having therein a region of a conductivity type opposite that of the main portion of said first and third layers and forming third and fourth p-n junctions, said regions being in non-overlapping relationship to each other; and a second region of conductivity type opposite that of said third layer within said third layer remote from said first region therein providing a fifth p-n junction;

b. a first main electrode overlying and secured to said first layer including said first region therein;

c. a second main electrode having an opening therein such that said electrode is overlying and secured to said third layer including said first region but not said second region therein;

d. a layer of active glass overlying and secured to said second region and spaced from said second main electrode, said active glass layer exhibiting high impedance characteristics when a voltage below a predetermined threshold is applied thereacross and low impedance characteristics when a voltage above said predetermined threshold is applied thereacross; and e. gate electrode means overlying and secured to said active glass layer for applying gating signals to said device;

whereby said device exhibits high or low impedance characteristics between said main electrodes in dependence upon a gating signal applied to said gate electrodes producing a voltage across said active glass layer below or above said predetermined threshold voltage.

2. The gated semiconductor device of claim 1 wherein said one conductivity type if N-type and said opposite conductivity type is P-type.

3. The gated semiconductor device of claim 1 wherein said active glass layer is a composition of tellurium, arsenic, germanium and silicon of preselected portions to achieve said high and low impedance characteristics when voltages below and above said predetermined value threshold voltage are respectively applied thereacross.

* * * * *